(12) United States Patent
Kawase

(10) Patent No.: US 7,442,355 B2
(45) Date of Patent: Oct. 28, 2008

(54) INDIUM PHOSPHIDE SUBSTRATE AND INDIUM PHOSPHIDE MONOCRYSTAL AND METHOD OF MANUFACTURING THEREOF

(75) Inventor: Tomohiro Kawase, Itami (JP)

(73) Assignee: Sumitomo Electric Industries, Ltd. (JP)

( * ) Notice: Subject to any disclaimer, the term of this patent is extended or adjusted under 35 U.S.C. 154(b) by 143 days.

(21) Appl. No.: 10/551,923

(22) PCT Filed: May 6, 2004

(86) PCT No.: PCT/JP2004/006427

§ 371 (c)(1),
(2), (4) Date: Oct. 3, 2005

(87) PCT Pub. No.: WO2004/106597

PCT Pub. Date: Dec. 9, 2004

(65) Prior Publication Data

US 2007/0101924 A1 May 10, 2007

(30) Foreign Application Priority Data

May 7, 2003 (JP) ............................. 2003-128831

(51) Int. Cl.
*C01B 33/26* (2006.01)
*C30B 11/04* (2006.01)
*C30B 28/14* (2006.01)

(52) U.S. Cl. ................ 423/328.2; 117/81; 117/83; 117/85

(58) Field of Classification Search ............. 117/81, 117/83, 85; 423/328.2
See application file for complete search history.

(56) References Cited

U.S. PATENT DOCUMENTS 5,647,917 A 7/1997 Oida et al.

FOREIGN PATENT DOCUMENTS

| JP | 03-040987 A | 2/1991 |
| JP | 03-237088 A | 10/1991 |
| JP | 08-078348 A | 3/1996 |
| JP | 11-302094 A | 11/1999 |
| JP | 2000-313699 A | 11/2000 |

OTHER PUBLICATIONS

International Preliminary Report on Patentability for PCT/JP2004/006427 mailed on Mar. 23, 2006.

(Continued)

*Primary Examiner*—Felisa C Hiteshew
(74) *Attorney, Agent, or Firm*—Darby & Darby P.C.

(57) ABSTRACT

An indium phosphide substrate for semiconductor devices is obtained as follows. In order to have the direction of growth of the crystal in the <100> orientation, a seed crystal having a specified cross-sectional area ratio with the crystal body is placed at the lower end of a growth container. The growth container housing the seed crystal, indium phosphide raw material, dopant, and boron oxide is placed in a crystal growth chamber. The temperature is raised to at or above the melting point of indium phosphide. After melting the boron oxide, indium phosphide raw material, and dopant, the temperature of the growth container is lowered in order to obtain an indium phosphide monocrystal having a low dislocation density and a uniform dopant concentration on the wafer as well as in the depth direction.

33 Claims, 3 Drawing Sheets

OTHER PUBLICATIONS

International Search Report for PCT/JP2004/006427 mailed Oct. 5, 2004.

P. Rudolph, et al., Studies on interface curvature during vertical Bridgman growth of InP in a flat-bottom container, Journal of Crystal Growth, 1996, vol. 158, pp. 43-48.

esp@cenet document view: Abstract of EP 0701008 published on Mar. 13, 1996.

Xiaoyu Hu, et al., Three Inch VGF Semi-insulating InP, Post Deadline Papers, Tenth International Conference on Indium Phosphide and Related Materials (IPRM '98), May 11-15, 1998, pp. 15-16.

Tomohiro Kawase, et al., Improvement of microscopic and macroscopic uniformity in 4-inch InP substrate for IC application by Vertical Boat Growth, GaAs IC Symposium, Technical Digest, Oct. 20-23, 2002, pp. 147-150.

T. Asahi, et al., Growth of 100mm Diameter <100> InP Single Crystals by the Vertical Gradient Freezing Method, Post Deadline Papers, Tenth International Conference on Indium Phosphide and Related Materials (IPRM '98), May 11-15, 1998, pp. 1-2.

Toshiaki Asahi, et al., Growth of 100-mm-Diameter <100> InP Single Crystals by the Vertical Gradient Freezing Method, Jpn. J. Appl. Phys. vol. 38, Feb. 1999, pp. 977-980.

T. Asahi, et al., VGF Crystal Growth and Vapor-Phase Fe Doping Technologies for Semi-Insulating 100mm Diameter InP Substrates, 11th International Conference on Indium Phosphide and Related Materials, May 16-20, 1999, pp. 249-254.

Fumio Matsumoto, et al., Growth of twin-free <100> InP single crystals by the liquid encapsulated vertical Bridgman technique, Jornal of Crystal Growth 132, 1998, pp. 348-350.

E.M. Monberg, et al., the Dynamic Gradient Freeze Growth of InP, Journal of Crystal Growth 94, 1989, pp. 109-114.

E. M. Monberg, The Growth and Characterization of Large Size, High Quality, InP Single Crystals, Micronanoelectronic Technology, vol. 2, pp. 55-59, Apr. 30, 1989.

Yoshihiro Hosokawa, et al., Development of 3-Inch-Diameter InP Single Crystals with Low Dislocation Density Using the VCZ Method, Sumitomo Electric Technical Review, No. 35, Jan. 1993, pp. 69-73.

0° ≦ θ ≦40°

US 7,442,355 B2

INDIUM PHOSPHIDE SUBSTRATE AND INDIUM PHOSPHIDE MONOCRYSTAL AND METHOD OF MANUFACTURING THEREOF

CROSS-REFERENCE TO PRIOR APPLICATION

This is a U.S. National Phase application under 35 U.S.C. §371 of International Patent Application No. PCT/JP2004/006427 filed on May 6, 2004. The International Application was published in Japanese on Dec. 9, 2004 as WO 2004/106597 A1 under PCT Article 21(2).

TECHNICAL FIELD

The present invention relates to an indium phosphide substrate, indium phosphide crystal, and method of manufacturing thereof used in the optoelectronics field such as semiconductor lasers for optical communication, photodetectors, and the like, and in the electronics field such as transistors and the like.

BACKGROUND ART

Indium phosphide (InP) crystals are manufactured by liquid encapsulated Czochralski method (LEC method) or vapor pressure controlled LEC method (VCZ method). Recently, growth of monocrystals of 3 inches diameter (approximately 75 mm) and 4 inches diameter (approximately 100 mm) by vertical gradient freezing method (VGF method) has been reported.

With the VGF method, it has been reported that because crystals are grown under a low temperature gradient, InP crystals with low dislocation density can be grown. For example, in 10$^{th}$ International Conference on Indium Phosphide and Related Materials, Post Deadline Papers, Tsukuba, Ibaraki (1998) 15-16, there is reporting of an Fe-doped InP crystal of 3 inches diameter. In this paper, it is reported that the etch pit density (EPD) of (100) wafer was 3,000 cm$^{-2}$. This etch pit density corresponds to the dislocation density of the crystal. In this paper, the growth orientation of the crystal is not shown. In Technical Digest of GaAs IC Symposium, Monterey, (2002) 147-150, with a commercial Fe-doped (100) InP wafer of 4 inches diameter, there was a large gradient in the etch pit density and photoluminescence (PL) intensity on the wafer, and Fe concentrations changed approximately two-fold. From this, the growth orientation of the commercial VGF crystal was presumed to be <111>. In addition, when Fe-doped InP crystals of 4 inches diameter are grown by the vertical boat method using a <100> seed, it has been reported that a (100) wafer with a dislocation density average value of 11,000 cm$^{-2}$ was obtained.

In addition, in the 10$^{th}$ International Conference on Indium Phosphide and related Materials, Post Deadline Papers, Tsukuba, Ibaraki (1998) 1-2, Japanese Journal of Applied Physics, 38 (1999) 977-980, there is reporting of an InP crystal of 100 mm diameter which was grown in the <100> orientation by VGF method. Furthermore, in the 11$^{th}$ International Conference on Indium Phosphide and Related Materials, Davos, Switzerland, (1999) 249-254, InP crystals of 100 mm diameter grown in the <100> orientation by VGF method were heat treated in an iron phosphide atmosphere to obtain Fe-doped (100) InP wafers of 100 mm diameter.

In addition, in Journal of Crystal Growth 132 (1993) 348-350 and Journal of Crystal Growth 158 (1996) 43-48, using a <100> oriented seed crystal which has approximately the same diameter as the crystal body and adding sulfur (S), a monocrystal of 50 mm diameter was obtained.

In the growth of InP crystals, twin generation is the most serious problem. In particular, with the vertical boat method in which crystals are grown in containers such as VGF method and vertical Bridgman method (VB method), when crystals are grown under a low temperature gradient, there is a high frequency of twin generation, and it is extremely difficult to obtain a monocrystal.

As a result, in Journal of Crystal Growth 94 (1989) 109-114, there is reported a method of growth in the <111> orientation in which twins are not readily generated. However, as described in Technical Digest of GaAs IC Symposium, Monterey (2002) 147-150, in order to use the usual (100) wafers, the (100) wafer must be sliced at an angle of 54.7 degrees with respect to the growth direction. As a result, there results a large gradient for the dopant concentration on the wafer. Commercial Fe-doped (100) InP wafers of 4 inches diameter (approximately 100 mm) have been reported to have approximately two-fold changes in Fe concentration on a wafer. When there is such a large change in Fe concentration, there are also large changes in electrical properties on the wafer. As a result, when this is used for optoelectronic devices such as semiconductor lasers for optical communication, photodetectors, and the like, and for electronic devices such as transistors and the like, the performance of the device is not constant on the wafer.

On the other hand, as described in Japanese Laid-Open Patent Number 11-302094, in order to prevent the generation of twins, the crystal growth rate at a tapered part is preferably 20 mm/hr or greater, and the slope angle for the tapered part of the inverse-conical crucible is 80 degrees or greater and less than 90 degrees with respect to the crystal central axis. Normally, the dopant is placed together with the raw material in the crucible, and crystal growth is conducted. However, if the growth speed is too fast, constitutional supercooling occurs, which results in polycrystallization. As described in 11$^{th}$ International Conference on Indium Phosphide and Related Materials, Davos, Switzerland, (1999) 249-254, a monocrystal in which dopant is not added is grown, and after making this into a wafer, heat treatment is conducted under an iron phosphide atmosphere in order to obtain an Fe-doped InP substrate. However, with this method in which dopant is diffused from the atmosphere, this may result in dopant concentrations higher in areas closer to the wafer surface. As a result, when using for optoelectronic devices such as semiconductor lasers for optical communication, photodetectors, and the like, and for electronic devices such as transistors and the like, the device performance may not be stable.

In addition, in Journal of Crystal Growth 158 (1996) 43-48, by using a <100> oriented crystal seed with a diameter approximately equal to that of the crystal, it is reported that non-doped or sulfur (S) doped monocrystal of 50 mm diameter was obtained. However, despite adding S, which has the effect of reducing dislocation density, at a high concentration of 2×10$^{18}$cm$^{-3}$, the etch pit density (EPD) was high at 8,000-10,000 cm$^{-2}$. With an InP substrate used in the optoelectronics field such as semiconductor lasers for optical communication, photodetectors, and the like, dislocation reduces the device performance and life span. Substrates with such a high dislocation density are problematic for practical use.

DISCLOSURE OF INVENTION

With the indium phosphide substrate containing a dopant of the present invention, the average dislocation density in the wafer is less than 5000 cm$^{-2}$, the ratio of the difference between the maximum value and minimum value with respect to the average value of the dopant concentration in the wafer is 30% or less, and the dopant is distributed substantially uniform through the thickness of the wafer. Furthermore, in the present invention, the average value of the dislocation density in the wafer is less than 2000 cm$^{-2}$, and the ratio of the difference between the maximum value and the minimum value with respect to the average value of the dopant concentration in the wafer is 30% or less, and the dopant is distributed substantially uniform through the thickness of the wafer.

By using this InP substrate, which has a low dislocation density and which has a uniform dopant concentration on the wafer and in the depth direction, in optoelectrical devices such as semiconductor lasers for optical communication, photodetectors, and the like, and in electronic devices such as transistors and the like, a compound semiconductor device with uniform and stable performance on a wafer and long life is achieved.

Dramatic advantages were seen when the InP substrate containing dopant of the present invention was 75 mm diameter or greater and further with 100 mm diameter or greater and containing a dopant of iron (Fe), sulfur (S), tin (Sn), or zinc (Zn).

In addition, the present invention is an InP crystal containing dopant with a growth direction in the <100> orientation, which has an average dislocation density of less than 5000 cm$^{-2}$ on the (100) plane perpendicular to the growth direction. In addition, the present invention is an InP crystal containing dopant with a growth direction in the <100> orientation, which has an average dislocation density of less than 2000 cm$^{-2}$ on the (100) plane perpendicular to the growth direction.

In addition, the diameter is 75 mm or greater, and further, the diameter is 100 mm or greater. The dopant is iron (Fe), sulfur (S), tin (Sn), or zinc (Zn).

The InP substrate obtained from this InP crystal is used in optoelectrical devices such as semiconductor lasers for optical communication, photodetectors, and the like, and in electronic devices such as transistors and the like to achieve a compound semiconductor device with uniform and stable performance on a wafer and a long life span.

For the InP monocrystal containing dopant having these properties, a seed crystal having a cross-sectional area of 15% or greater of the cross-sectional area of the crystal body is placed at the lower end of a growth container so that the growth direction of the crystal will be in the <100> orientation. Furthermore, the growth container containing indium phosphide raw material, dopant, and boron oxide is installed in a crystal growth chamber and heated to a temperature at or above the melting point of indium phosphide. After heating and melting the boron oxide, indium phosphide raw material, and dopant, the temperature of the growth container is lowered, and the InP monocrystal is obtained. More preferably, the seed crystal has a cross-sectional area of 50% or greater of the cross-sectional area of the crystal body, and in addition, it is preferably 98% or less of the cross-sectional area of the crystal body.

The reason for using a seed crystal that has a cross-sectional area of 15% or greater, and preferably 50% or greater of the cross-sectional area of the crystal body is to reduce the frequency of twin generation by reducing the surface area of the tapering part where twin generation is likely to occur. In addition, the reason for having the cross-sectional area of 98% or less is because the seed crystal must have a cross-sectional area smaller than the crystal body to fit properly in the crucible bottom portion.

In addition, in the longitudinal cross-section which includes the crystal central axis, the slope angle of the tapered part from the seed crystal to the crystal body is preferably 40 degrees or less with respect to the crystal central axis (see FIG. 1), and it is more preferably 20 degrees or less.

In the longitudinal cross-section which includes the crystal central axis, the reason for having the slope angle of the tapered part from the seed crystal to the crystal body with 40 degrees or less and preferably 20 degrees or less is because with smaller changes in the crystal diameter, growth is more stable, and twin generation is less likely to occur.

Furthermore, the average dislocation density of the seed crystal is preferably less than 5000 cm$^{-2}$, and more preferably less than 2000 cm$^{-2}$. In addition, the seed crystal preferably has an average dislocation density that is lower than the average dislocation density of the target crystal to be grown.

The present inventors have discovered that when using a seed crystal having a cross-sectional area of 15% or greater, and preferably 50% or greater of the cross-sectional area of the crystal body, the dislocation density of the crystal largely depends on the dislocation density of the seed crystal. In order to obtain a dopant-containing InP crystal with an average dislocation density of less than 5000 cm$^{-2}$ on the (100) wafer, or an average dislocation density of less than 2000 cm$^{-2}$, a seed crystal with a low dislocation density of less than 5000 cm$^{-2}$ or less than 2000 cm$^{-2}$ is preferably used. The present inventors have discovered that it is preferable to have a seed crystal with an average dislocation density lower than the target dislocation density of the crystal to be grown.

In the present invention, the indium phosphide raw material, dopant, and a portion of the seed crystal are maintained in a melted state for a fixed period of time, preferably 1 hour or more, more preferably 3 hours or more, and more preferably 5 hours or more. Afterwards, the temperature of the growth container is lowered, and a monocrystal having a <100> orientation is grown. When using a seed crystal having a cross-sectional area of 15% or greater, and preferably 50% or greater of the cross-sectional area of the crystal body, more time is needed to stabilize the interface position of the raw material melt and the seed crystal as compared to when using a seed crystal with a small relative cross-section (around 1%) as in the prior art. Furthermore, by maintaining the melt for a fixed period of time, the dopant concentration in the melt is made more uniform.

The growth rate for growing the crystal from the seed crystal is preferably 10 mm/hour or less, and more preferably 5 mm/hour or less. When the growth rate for growing crystal from seed crystal is too fast, constitutional supercooling occurs, which results in polycrystallization.

Furthermore, the growth rate when growing the crystal from the seed crystal is preferably 2.5 mm/hour or greater. If the growth rate when growing crystal from seed crystal is too slow, defects such as twins or polycrystals are more readily generated at the start of growth. Near the interface of the seed crystal and the melt, there is a temperature fluctuation due to the effect of melt convection. When growing under a low temperature gradient, this temperature fluctuation strongly influences the stability of crystal growth. The present inventors discovered that, when the growth rate when the crystal begins to grow from seed crystal, is 2.5 mm/hour or greater, defects such as twins and polycrystals are not readily generated at the start of growth.

The growth container is preferably a pyrolytic boron nitride (pBN) container. Prior to housing the seed crystal, indium phosphide raw material, dopant, and boron oxide in the growth container, the inner surface of the growth container, at least the part which will come into contact with the melt, is preferably coated with a boron oxide film.

When using a seed crystal with larger diameter having a cross-sectional area of 15% or greater, and preferably 50% or greater of the cross-sectional area of the crystal body, using a crucible of material which easily deforms such as quartz results in a larger deformation as compared to when using a seed crystal with smaller diameter. Therefore, a pBN crucible which has adequate strength at growth temperatures is preferred. In addition, with a pBN crucible, if the inner surface of the crucible is not coated with boron oxide ($B_2O_3$), the crystal or the melt will come into contact with the crucible and polycrystallization occurs. When using a seed crystal with larger diameter having a cross-sectional area of 15% or greater, and preferably 50% or greater of the cross-sectional area of the crystal body, the surface area of the seed crystal is large as compared to the seed crystal with smaller diameter. As a result, there is a higher possibility of the crystal or the melt coming in contact with the crucible. Prior to housing the seed crystal, indium phosphide raw material, dopant, and boron oxide in the growth container, the inner surface of the growth container, at least the part which will come into contact with the melt, is coated with a boron oxide film, thereby preventing contact of the crystal or the melt with the crucible and preventing polycrystallization.

In this manner, an InP monocrystal with a diameter of 75 mm or greater and also 100 mm or greater containing a dopant of iron (Fe), sulfur (S), tin (Sn), or zinc (Zn) is obtained. In addition, this crystal is processed to obtain an InP substrate for use in optoelectronic devices such as semiconductor laser for optical communication, photodetector, and the like and electronic devices such as transistor and the like. This results in compound semiconductor devices with uniform and stable performance on the wafer and excellent life span.

BEST MODE FOR CARRYING OUT THE INVENTION

Embodiment 1

An <100> InP seed crystal of 40 mm diameter and 40 mm length is placed in a pBN crucible 1 which has an inner diameter of approximately 105 mm and which has a boron oxide ($B_2O_3$) film on the inner surface. The cross-sectional area ratio of the seed crystal with respect to the crystal body is 15%. In addition, the tapered part from the seed crystal to the crystal body has a slope angle of 40 degrees with respect to the crystal central axis. The target value for the average dislocation density of the crystal to be grown is less than 5000 $cm^{-2}$, and a seed crystal with an average dislocation density of 4500 $cm^{-2}$ is used. For the dopant, high purity Fe is used, and this is housed in the pBN crucible together with 10 kg of InP polycrystal and 0.5 kg of boron oxide. The weight of high purity Fe placed in the crucible is adjusted so that the concentration at the front end of the straight body section is $2 \times 10^{16}$ $cm^{-3}$.

Figure 1:
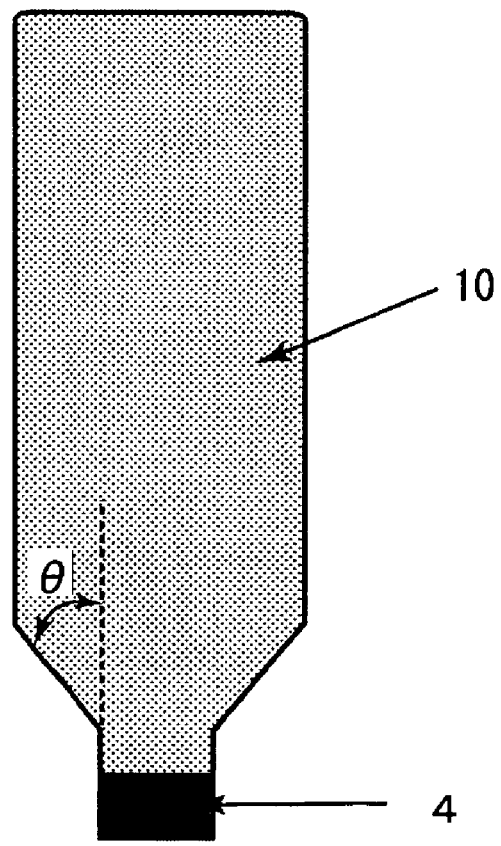
FIG. 1 is an example of the shape of an indium phosphide (InP) monocrystal manufactured in the present invention.
Figure 2:
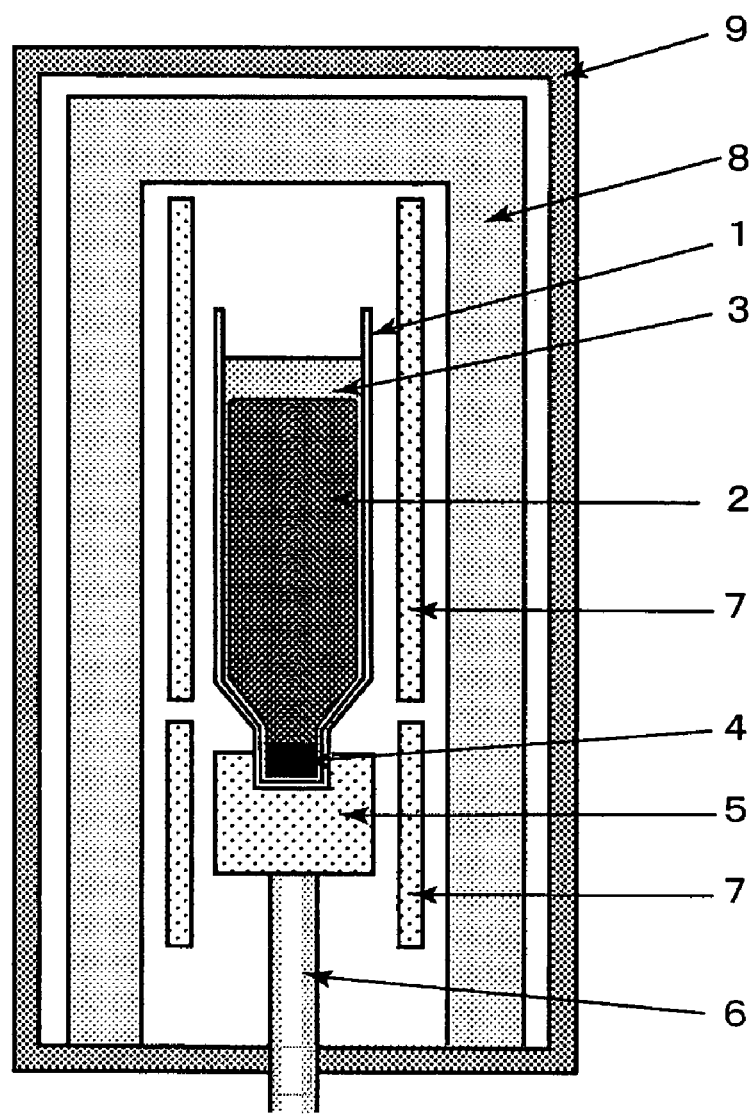
FIG. 2 is an example of a longitudinal cross-section of an InP crystal manufacturing equipment used in the present invention.
Figure 3:
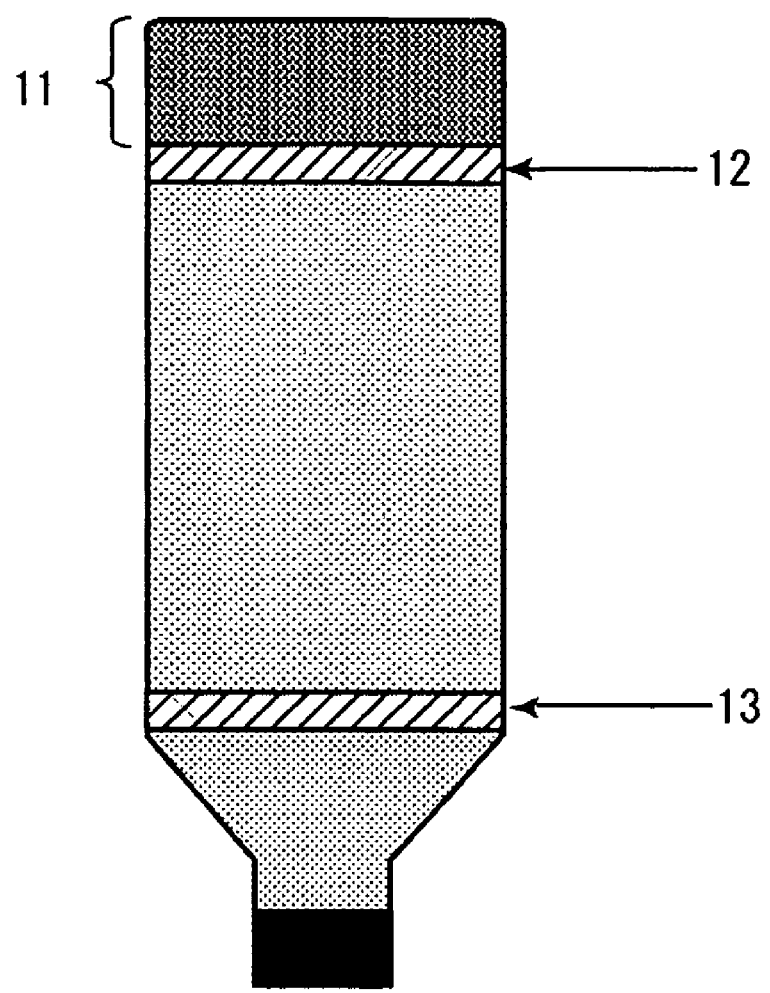
FIG. 3 is the sample positions for measuring the etch pit density and dopant concentration.

Crystal growth is seen in FIG. 2. For the growth of InP monocrystal, a high pressure chamber 9 made of stainless steel is used. A crucible support 5 is installed on the upper end of a lower shaft 6 provided at the center of the high pressure chamber. Lower shaft 6 can be rotated and moved downward. A graphite heater 7 and a graphite heat insulating material 8 are placed around crucible support 5. The pBN crucible with a seed crystal 4, raw material, dopant, and boron oxide is placed on the crucible support. The high pressure chamber is sealed, and evacuated over a fixed period of time, and after pressurizing with nitrogen gas, the heater is electrified, and the temperature is raised.

As the temperature rises, boron oxide 3 softens first, and covers the entire InP raw material. Once the temperature exceeds the melting point of InP, the raw material begins to melt. The raw material is completely melted, and the pressure inside the high pressure chamber is adjusted to approximately 4 MPa. A portion of the seed crystal is melted and allowed to be mixed with InP melt 2. After maintaining the melt for 1 hour, the crucible support is moved downward at a speed of 10 mm/hour while being rotated at 5 rpm, and an InP monocrystal is grown.

After crystal growth is completed, the crystal is cooled to room temperature and removed from the pBN crucible. An InP crystal 10 with a diameter in the crystal body portion of 105 mm and a length of approximately 220 mm is obtained. Because 40 mm of the tail end portion is a polycrystalline portion 11 due to the precipitation of Fe, the monocrystal portion is approximately 180 mm. Wafers are sliced at the front end and the tail end of the crystal body, and using Huber etching solution, the etch pit density is measured. At the front end, the etch pit density is 4800 $cm^{-2}$, and at the tail end, that is 4000 $cm^{-2}$. This satisfies the target value of less than 5000 $cm^{-2}$.

In addition, with regard to the wafer sliced at a front end 13 of the crystal straight body portion, the distribution of the Fe concentration in the wafer is measured by the GDMS method. The wafer center portion has the lowest concentration at $2 \times 10^{16}$ $cm^{-3}$. On the other hand, when the Fe concentration is measured at 2.5 mm inside from the wafer periphery, the Fe concentration is $2.2 \times 10^{16}$ $cm^{-3}$. The ratio of the difference between the maximum value and the minimum value with respect to the average value is 10%. Similarly, with regard to the wafer sliced at a tail end 12 of crystal straight body portion, the distribution of the Fe concentration in the wafer is measured by the GDMS method. The wafer center has the lowest concentration at $9.5 \times 10^{16}$ $cm^{-3}$. The Fe concentration at 2.5 mm inside from the wafer periphery is $10.5 \times 10^{16}$ $cm^{-3}$. The ratio of the difference between the maximum value and minimum value with respect to the average value of the dopant concentration is 10%.

The InP monocrystal that is obtained as described above is processed into a double sided mirror wafer of 100 mm diameter and 625 micrometers thickness. The Fe concentration in the depth direction is measured by the SIMS method. While removing the wafer by 10 micrometers depth from the surface by etching and polishing, the Fe concentration is measured from the surface to 100 micrometers depth. The 100 micrometer depth is thought to be an adequate depth for device fabrication. With both the wafers sliced from the front end and tail end of the crystal body portion, the Fe concentration distribution is within ±5%. It can be seen that there is no problem in the uniformity of the Fe concentration for the fabrication of devices.

Embodiment 2

An <100> InP seed crystal of 75 mm diameter and 30 mm length is placed in a pBN crucible 1 which has an inner diameter of approximately 105 mm and which has a boron oxide ($B_2O_3$) film on the inner surface. The cross-sectional area ratio of the seed crystal with respect to the crystal body is 50%. In addition, the tapered part from the seed crystal to the crystal body has a slope angle of 20 degrees with respect to the crystal central axis. The target value for the average dislocation density of the crystal to be grown is less than 3000 $cm^{-2}$, and a seed crystal with an average dislocation density of 2500 $cm^{-2}$ is used. For the dopant, high purity Fe is used, and this is housed in the pBN crucible together with 10 kg of InP polycrystal and 0.5 kg of boron oxide. The weight of high purity Fe placed in the crucible is adjusted so that the concentration at the front end of the straight body section is $2\times10^{16}$ $cm^{-3}$.

For the growth of InP monocrystal, a high pressure chamber 9 made of stainless steel is used. A crucible support 5 is installed on the upper end of a lower shaft 6 provided at the center of the high pressure chamber. Lower shaft 6 can be rotated and moved downward. A graphite heater 7 and a graphite heat insulating material 8 are placed around crucible support 5. The pBN crucible with a seed crystal 4, raw material, dopant, and boron oxide are placed on the crucible support. The high pressure chamber is sealed, and evacuated over a fixed period of time, and after pressurizing with nitrogen gas, the heater is electrified, and the temperature is raised.

As the temperature rises, boron oxide 3 softens first, and covers the entire InP raw material. Once the temperature exceeds the melting point of InP, the raw material begins to melt. The raw material is completely melted, and the pressure inside the high pressure chamber is adjusted to approximately 4 MPa. A portion of the seed crystal is melted and allowed to be mixed with InP melt 2. After maintaining the melt for 3 hours, the crucible support is moved downward at a speed of 5 mm/hour while being rotated at 5 rpm, and an InP monocrystal is grown.

After crystal growth is completed, the crystal is cooled to room temperature and removed from the pBN crucible. An InP crystal 10 with a diameter in the crystal body portion of 105 mm and a length of approximately 220 mm is obtained. Because 25 mm of the tail end portion is a polycrystalline portion 11 due to the precipitation of Fe, the monocrystal portion is approximately 195 mm. Wafers are sliced at the front end and the tail end of the crystal body, and using Huber etching solution, the etch pit density is measured. At the front end, the etch pit density is 2500 $cm^{-2}$, and at the tail end, that is 2000 $cm^{-2}$. This satisfies the target value of less than 3000 $cm.^{-2}$.

In addition, with regard to the wafer sliced at a front end 13 of the crystal straight body portion, the distribution of the Fe concentration in the wafer is measured by the GDMS method. The wafer center portion has the lowest concentration at $2\times10^{16}$ $cm^{-3}$. On the other hand, when the Fe concentration is measured at 2.5 mm inside from the wafer periphery, the Fe concentration is $2.45\times10^{16}$ $cm^{-3}$. The ratio of the difference between the maximum value and the minimum value with respect to the average value is 20%. Similarly, with regard to the wafer sliced at a tail end 12 of crystal straight body portion, the distribution of the Fe concentration in the wafer is measured by the GDMS method. The wafer center has the lowest concentration at $10\times10^{16}$ $cm^{-3}$. The Fe concentration at 2.5 mm inside from the wafer periphery is $12.2\times10^{16}$ $cm^{-3}$. The ratio of the difference between the maximum value and minimum value with respect to the average value of the dopant concentration is 20%.

The InP monocrystal that is obtained as described above is processed into a double sided mirror wafer of 100 mm diameter and 625 micrometers thickness. The Fe concentration in the depth direction is measured by the SIMS method. While removing the wafer by 10 micrometers depth from the surface by etching and polishing, the Fe concentration is measured from the surface to 100 micrometers depth. The 100 micrometer depth is thought to be an adequate depth for device fabrication. With both the wafers sliced from the front end and tail end of the crystal body portion, the Fe concentration distribution is within ±5%. It can be seen that there is no problem in the uniformity of the Fe concentration for the fabrication of devices.

Embodiment 3

An <100> InP seed crystal of 98 mm diameter and 20 mm length is placed in a pBN crucible 1 which has an inner diameter of approximately 105 mm and which has a boron oxide ($B_2O_3$) film on the inner surface. The cross-sectional area ratio of the seed crystal with respect to the crystal body is 87%. In addition, the tapered part from the seed crystal to the crystal body has a slope angle of 10 degrees with respect to the crystal central axis. The target value for the average dislocation density of the crystal to be grown is set at less than 2000 $cm^{-2}$, and a seed crystal with an average dislocation density of 1500 $cm^{-2}$ is used. For the dopant, high purity Fe is used, and this is housed in the pBN crucible together with 10 kg of InP polycrystal and 0.5 kg of boron oxide. The weight of high purity Fe placed in the crucible is adjusted so that the concentration at the front end of the straight body section of the crystal is $2\times10^{16}$ $cm^{-3}$.

For the growth of InP monocrystal, a high pressure chamber 9 made of stainless steel is used. A crucible support 5 is installed on the upper end of a lower shaft 6 provided at the center of the high pressure chamber. Lower shaft 6 can be rotated and moved downward. A graphite heater 7 and a graphite heat insulating material 8 are placed around crucible support 5. The pBN crucible with a seed crystal 4, raw material, dopant, and boron oxide are placed on the crucible support. The high pressure chamber is sealed, and evacuated over a fixed period of time, and after pressurizing with nitrogen gas, the heater is electrified, and the temperature is raised.

As the temperature rises, boron oxide 3 softens first, and covers the entire InP raw material. Once the temperature exceeds the melting point of InP, the raw material begins to melt. The raw material is completely melted, and the pressure inside the high pressure chamber is adjusted to approximately 4 MPa. A portion of the seed crystal is melted and allowed to be mixed with InP melt 2. After maintaining the melt for 5 hours, the crucible support is moved downward at a speed of 3 mm/hour while being rotated at 5 rpm, and an InP monocrystal is grown.

After crystal growth is completed, the crystal is cooled to room temperature and removed from the pBN crucible. An InP crystal 10 with a diameter in the crystal body portion of 105 mm and a length of approximately 220 mm is obtained. Because 20 mm of the tail end portion is a polycrystalline portion 11 due to the precipitation of Fe, the monocrystal portion is approximately 200 mm. Wafers are sliced at the front end and the tail end of the crystal body, and using Huber etching solution, the etch pit density is measured. At the front end, the etch pit density is 1800 $cm^{-2}$, and at the tail end, that is 1200 $cm^{-2}$. This satisfies the target value of less than 2000 $cm^{-2}$.

In addition, with regard to the wafer sliced at a front end 13 of the crystal straight body portion, the distribution of the Fe concentration in the wafer is measured by the GDMS method. The wafer center has the lowest concentration at $2\times10^{16}$ $cm^{-3}$. On the other hand, when the Fe concentration is measured at 2.5 mm inside from the wafer periphery, the Fe concentration is $2.7 \times 10^{16}$ cm$^{-3}$. The ratio of the difference between the maximum value and the minimum value with respect to the average value is 30%. Similarly, with regard to the wafer sliced at a tail end 12 of crystal straight body portion, the distribution of the Fe concentration in the wafer is measured by the GDMS method. The wafer center has the lowest concentration at $10 \times 10^{16}$ cm$^{-3}$. The Fe concentration at 2.5 mm inside from the wafer periphery is $13.5 \times 10^{16}$ cm$^{-3}$. The ratio of the difference between the maximum value and minimum value with respect to the average value of the dopant concentration is 30%.

The InP monocrystal that is obtained as described above is processed into a double sided mirror wafer of 100 mm diameter and 625 micrometers thickness. The Fe concentration in the depth direction is measured by the SIMS method. While removing the wafer by 10 micrometers depth from the surface by etching and polishing, the Fe concentration is measured from the surface to 100 micrometers depth. The 100 micrometer depth is thought to be an adequate depth for device fabrication. With both the wafers sliced from the front end and tail end of the crystal body portion, the Fe concentration distribution is within ±5%. It can be seen that there is no problem in the uniformity of the Fe concentration for the fabrication of devices.

Embodiment 4

An <100> InP seed crystal of 98 mm diameter and 20 mm length is placed in a pBN crucible 1 which has an inner diameter of approximately 105 mm and which has a boron oxide ($B_2O_3$) film on the inner surface. The cross-sectional area ratio of the seed crystal with respect to the crystal body is 87%. In addition, the tapered part from the seed crystal to the crystal body has a slope angle of 10 degrees with respect to the crystal central axis. The target value for the average dislocation density of the crystal to be grown is set at less than 1000 cm$^{-2}$, and a seed crystal with an average dislocation density of 500 cm$^{-2}$ is used. For the dopant, $In_2S_3$ is used, and this is housed in the pBN crucible 1 together with 10 kg of InP polycrystal and 0.5 kg of boron oxide. The weight of $In_2S_3$ placed in the crucible is adjusted so that the concentration at the front end of the straight body section of the crystal is $1 \times 10^{18}$ cm$^{-3}$.

For the growth of InP monocrystal, a high pressure chamber 9 made of stainless steel is used. A crucible support 5 is installed on the upper end of a lower shaft 6 provided at the center of the high pressure chamber. Lower shaft 6 can be rotated and moved downward. A graphite heater 7 and a graphite heat insulating material 8 are placed around crucible support 5. The pBN crucible with a seed crystal 4, raw material, dopant, and boron oxide are placed on the crucible support. The high pressure chamber is sealed, and evacuated over a fixed period of time, and after pressurizing with nitrogen gas, the heater is electrified, and the temperature is raised.

As the temperature rises, boron oxide 3 softens first, and covers the entire InP raw material. Once the temperature exceeds the melting point of InP, the raw material begins to melt. The raw material is completely melted, and the pressure inside the high pressure chamber is adjusted to approximately 4 MPa. A portion of the seed crystal is melted and allowed to be mixed with InP melt 2. After maintaining the melt for 5 hours, the crucible support is moved downward at a speed of 3 mm/hour while being rotated at 5 rpm, and an InP monocrystal is grown.

After crystal growth is completed, the crystal is cooled to room temperature and removed from the pBN crucible. An InP crystal 10 with a diameter in the crystal body portion of 105 mm and a length of approximately 220 mm is obtained. Wafers are sliced at the front end and the tail end of the crystal body, and using Huber etching solution, the etch pit density is measured. At the front end, the etch pit density is 500 cm$^{-2}$, and at the tail end, that is 100 cm$^{-2}$. This satisfies the target value of less than 1000 cm$^{-2}$.

In addition, with regard to the wafer sliced at a front end 13 of the crystal straight body portion, the distribution of the S concentration in the wafer is measured by the GDMS method. The wafer center has the lowest concentration at $1 \times 10^{18}$ cm$^{-3}$. On the other hand, when the S concentration is measured at 2.5 mm inside from the wafer periphery, the S concentration is $1.1 \times 10^{18}$ cm$^{-3}$. The ratio of the difference between the maximum value and the minimum value with respect to the average value is 10%. Similarly, with regard to the wafer sliced at a tail end 12 of crystal straight body portion, the distribution of the S concentration in the wafer is measured by the GDMS method. The wafer center has the lowest concentration at $3 \times 10^{18}$ cm$^{-3}$. The S concentration at 2.5 mm inside from the wafer periphery is $3.3 \times 10^{18}$ cm$^{-3}$. The ratio of the difference between the maximum value and minimum value with respect to the average value of the dopant concentration is 10%.

The InP monocrystal that is obtained as described above is processed into a double sided mirror wafer of 100 mm diameter and 625 micrometers thickness. The S concentration in the depth direction is measured by the SIMS method. While removing the wafer by 10 micrometers depth from the surface by etching and polishing, the S concentration is measured from the surface to 100 micrometers depth. The 100 micrometer depth is thought to be an adequate depth for device fabrication. With both the wafers sliced from the front end and tail end of the crystal body portion, the S concentration distribution is within ±5%. It can be seen that there is no problem in the uniformity of the S concentration for the fabrication of devices.

Embodiment 5

An <100> InP seed crystal of 98 mm diameter and 20 mm length is placed in a pBN crucible 1 which has an inner diameter of approximately 105 mm and which has a boron oxide ($B_2O_3$) film on the inner surface. The cross-sectional area ratio of the seed crystal with respect to the crystal body is 87%. In addition, the tapered part from the seed crystal to the crystal body has a slope angle of 10 degrees with respect to the crystal central axis. The target value for the average dislocation density of the crystal to be grown is set at less than 2000 cm$^{-2}$, and a seed crystal with an average dislocation density of 1500 cm$^{-2}$ is used. For the dopant, Sn is used, and this is housed in the pBN crucible together with 10 kg of InP polycrystal and 0.5 kg of boron oxide. The weight of Sn placed in the crucible is adjusted so that the Sn concentration at the front end of the straight body section of the crystal is $1 \times 10^{18}$ cm$^{-3}$.

For the growth of InP monocrystal, a high pressure chamber 9 made of stainless steel is used. A crucible support 5 is installed on the upper end of a lower shaft 6 provided at the center of the high pressure chamber. Lower shaft 6 can be rotated and moved downward. A graphite heater 7 and a graphite heat insulating material 8 are placed around crucible support 5. The pBN crucible with a seed crystal 4, raw material, dopant, and boron oxide are placed on the crucible support. The high pressure chamber is sealed, and evacuated over a fixed period of time, and after pressurizing with nitrogen gas, the heater is electrified, and the temperature is raised.

As the temperature rises, boron oxide 3 softens first, and covers the entire InP raw material. Once the temperature exceeds the melting point of InP, the raw material begins to melt. The raw material is completely melted, and the pressure inside the high pressure chamber is adjusted to approximately 4 MPa. A portion of the seed crystal is melted and allowed to be mixed with InP melt 2. After maintaining the melt for 5 hours, the crucible support is moved downward at a speed of 3 mm/hour while being rotated at 5 rpm, and an InP monocrystal is grown.

After crystal growth is completed, the crystal is cooled to room temperature and removed from the pBN crucible. An InP crystal 10 with a diameter in the crystal body portion of 105 mm and a length of approximately 220 mm is obtained. Because 20 mm of the tail end portion is a polycrystalline portion 11 due to the precipitation of Sn, the monocrystal portion is approximately 200 mm. Wafers are sliced at the front end and the tail end of the crystal body, and using Huber etching solution, the etch pit density is measured. At the front end, the etch pit density is 1500 $cm^{-2}$, and at the tail end, that is 1000 $cm^{-2}$. This satisfies the target value of less than 2000 $cm^{-2}$.

In addition, with regard to the wafer sliced at a front end 13 of the crystal straight body portion, the distribution of the Sn concentration in the wafer is measured by the GDMS method. The wafer center has the lowest concentration at $1\times10^{18}$ $cm^{-3}$. On the other hand, when the Sn concentration is measured at 2.5 mm inside from the wafer periphery, the Sn concentration is $1.16\times10^{18}$ $cm^{-3}$. The ratio of the difference between the maximum value and the minimum value with respect to the average value is 15%. Similarly, with regard to the wafer sliced at a tail end 12 of crystal straight body portion, the distribution of the Sn concentration in the wafer is measured by the GDMS method. The wafer center has the lowest concentration at $5\times10^{18}$ $cm^{-3}$. The Sn concentration at 2.5 mm inside from the wafer periphery is $5.8\times10^{18}$ $cm^{-3}$. The ratio of the difference between the maximum value and minimum value with respect to the average value of the dopant concentration is 15%.

The InP monocrystal that is obtained as described above is processed into a double sided mirror wafer of 100 mm diameter and 625 micrometers thickness. The Sn concentration in the depth direction is measured by the SIMS method. While removing the wafer by 10 micrometers depth from the surface by etching and polishing, the Sn concentration is measured from the surface to 100 micrometers depth. The 100 micrometer depth is thought to be an adequate depth for device fabrication. With both the wafers sliced from the front end and tail end of the crystal body portion, the Sn concentration distribution is within ±5%. It can be seen that there is no problem in the uniformity of the Sn concentration for the fabrication of devices.

INDUSTRIAL APPLICABILITY

When an InP substrate obtained by processing a crystal of the present invention is used for optoelectronic devices such as semiconductor lasers for optical communication, photodetectors, or the like, or as a substrate for electronic devices such as transistors or the like, a compound semiconductor device having uniform and stable performance on the wafer and having an excellent life span is achieved.

The invention claimed is:

1. An indium phosphide substrate containing iron or tin as a dopant, comprising:
    an average dislocation density value of a wafer being less than 5000 $cm^{-2}$;
    a ratio of the difference between a maximum value and a minimum value with respect to an average value of dopant concentration in said wafer being 30% or less;
    a substantially uniform distribution of said dopant concentration in the depth direction of said wafer.

2. An indium phosphide substrate according to claim 1, wherein:
    diameter of said substrate is 75 mm or greater.

3. An indium phosphide substrate according to claim 1, wherein:
    diameter of said substrate is 100 mm or greater.

4. An indium phosphide substrate containing iron or tin as a dopant, comprising:
    an average dislocation density value of a wafer being less than 2000 $cm^{-2}$;
    a ratio of the difference between a maximum value and a minimum value with respect to an average value of dopant concentration in said wafer being 30% or less;
    a substantially uniform distribution of dopant concentration in the depth direction of said wafer.

5. An indium phosphide substrate containing sulfur or zinc as a dopant and having a diameter greater than or equal to 100 mm, comprising:
    an average dislocation density value of a wafer being less than 5000 $cm^{-2}$;
    a ratio of the difference between a maximum value and a minimum value with respect to an average value of dopant concentration in said wafer being 30% or less;
    a substantially uniform distribution of said dopant concentration in the depth direction of said wafer.

6. An indium phosphide substrate containing sulfur or zinc as a dopant and having a diameter greater than or equal to 100 mm, comprising:
    an average dislocation density value of a wafer being less than 2000 $cm^{-2}$;
    a ratio of the difference between a maximum value and a minimum value with respect to an average value of dopant concentration in said wafer being 30% or less;
    a substantially uniform distribution of said dopant concentration in the depth direction of said wafer.

7. An indium phosphide crystal containing tin as a dopant, wherein:
    a direction of growth has a <100> orientation; and
    an average dislocation density value on a (100) plane, which is perpendicular to said growth direction, is less than 5000 $cm^{-2}$.

8. An indium phosphide crystal according to claim 7, wherein:
    a diameter of said crystal is 75 mm or greater.

9. An indium phosphide crystal according to claim 7, wherein:
    a diameter of said crystal is 100 mm or greater.

10. An indium phosphide crystal containing iron or tin as a dopant, wherein:
    a direction of growth has a <100> orientation; and
    an average dislocation density value on a (100) plane, which is perpendicular to said growth direction, is less than 2000 $cm^{-2}$.

11. An indium phosphide crystal containing sulfur or zinc as a dopant and having a diameter of 100 mm or more, wherein:
    a direction of growth has a <100> orientation;
    an average dislocation density value on a (100) plane, which is perpendicular to said growth direction, is less than 5000 $cm^{-2}$.

12. An indium phosphide crystal containing sulfur or zinc as a dopant and having a diameter of 100 mm or more, wherein:
   a direction of growth has a <100> orientation; and
   an average dislocation density value on a (100) plane, which is perpendicular to said growth direction, is less than 2000 cm$^{-2}$.

13. An indium phosphide crystal containing iron as a dopant, wherein:
   a direction of growth has a <100> orientation; and
   an average dislocation density value on a (100) plane, which is perpendicular to said growth direction, is less than 2500 cm$^{-2}$.

14. An indium phosphide crystal according to claim 13, wherein:
   a diameter of said crystal is 75 mm or greater.

15. An indium phosphide crystal according to claim 13, wherein:
   a diameter of said crystal is 100 mm or greater.

16. A method for manufacturing an indium phosphide monocrystal containing a dopant, comprising:
   placing a seed crystal, which has a cross-sectional area of 15% to 98% of a cross-sectional area of a crystal body, has an average dislocation density of less than 5000 cm$^{-2}$ and has a substantially constant cross-sectional area along a length direction, at a lower end of a growth container so that direction of growth of said crystal is <100> oriented, said growth container including a seed crystal housing region having a substantially constant cross-sectional area, a crystal body housing region having a cross-sectional area larger than that of the seed crystal housing region, and a tapering region between the seed crystal housing region and the crystal body housing region;
   placing said growth container containing said seed crystal, indium phosphide raw material, dopant, and boron oxide in a crystal growth chamber, and raising the temperature to at or above the melting point of indium phosphide;
   after heating and melting boron oxide, indium phosphide raw material, dopant, and a portion of said seed crystal, lowering the temperature of said growth container in order to grow a monocrystal with a <100> orientation in a longitudinal direction of said growth container.

17. A method for manufacturing an indium phosphide monocrystal according to claim 16, wherein:
   in a longitudinal cross-section which includes a crystal central axis, an angle of said tapering region from said seed crystal to said crystal body with respect to said crystal central axis is 40 degrees or less.

18. A method for manufacturing an indium phosphide monocrystal according to claim 16, wherein:
   in a longitudinal cross-section which includes a crystal central axis, an angle of said tapering region from said seed crystal to said crystal body with respect to said crystal central axis is 20 degrees or less.

19. A method for manufacturing an indium phosphide monocrystal according to claim 16, wherein:
   said seed crystal has an average dislocation density of less than 2000 cm$^{-2}$.

20. A method for manufacturing an indium phosphide monocrystal according to claim 16, wherein:
   said seed crystal has an average dislocation density that is lower than a target average dislocation density of said crystal which is to be grown.

21. A method for manufacturing an indium phosphide monocrystal according to claim 16, wherein:
   after maintaining said indium phosphide raw material, dopant, and a portion of said seed crystal in a heated melted state for a fixed period of time, the temperature of said growth container is lowered in order to grow a monocrystal with a <100> orientation in a longitudinal direction of said growth container.

22. A method for manufacturing an indium phosphide monocrystal according to claim 21, wherein:
   after maintaining said indium phosphide raw material, dopant, and a portion of said seed crystal in a heated melted state for 1 hour or more, the temperature of said growth container is lowered in order to grow a monocrystal with a <100> orientation in a longitudinal direction of said growth container.

23. A method for manufacturing an indium phosphide monocrystal containing a dopant according to claim 16, wherein:
   growth rate when growing said crystal from said seed crystal is 10 mm/hour or less.

24. A method for manufacturing an indium phosphide monocrystal containing a dopant according to claim 16, wherein:
   growth rate when growing said crystal from said seed crystal is 5 mm/hour or less.

25. A method for manufacturing an indium phosphide monocrystal containing a dopant according to claim 16, wherein:
   growth rate when growing said crystal from said seed crystal is 2.5 mm/hour or greater.

26. A method for manufacturing an indium phosphide monocrystal containing a dopant according to claim 16, wherein:
   said growth container is a pBN (pyrolytic boron nitride) container.

27. A method for manufacturing an indium phosphide monocrystal containing a dopant according to claim 16, wherein:
   prior to housing said seed crystal, indium phosphide raw material, dopant, and boron oxide in said growth container, an inner surface of said growth container, at least a part which will come into contact with a melt produced by the melting step, is coated with a boron oxide film.

28. A method for manufacturing an indium phosphide monocrystal containing a dopant according to claim 16, wherein:
   said crystal body has a diameter of 75 mm or greater.

29. A method for manufacturing an indium phosphide monocrystal according to claim 16, wherein:
   said crystal body has a diameter of 100 mm or greater.

30. A method for manufacturing an indium phosphide monocrystal according to claim 16, wherein:
   said dopant is Fe (iron).

31. A method for manufacturing an indium phosphide monocrystal containing a dopant according to claim 16, wherein:
   said dopant is S (sulfur).

32. A method for manufacturing an indium phosphide monocrystal containing a dopant according to claim 16, wherein:
   said dopant is Sn (tin).

33. A method for manufacturing an indium phosphide monocrystal containing a dopant according to claim 16, wherein:
   said dopant is Zn (zinc).

* * * * *